US012610675B2

(12) United States Patent
Yao et al.

(10) Patent No.: US 12,610,675 B2
(45) Date of Patent: Apr. 21, 2026

(54) CIRCUIT BOARD, LIGHT-EMITTING SUBSTRATE, BACKLIGHT MODULE, DISPLAY PANEL AND DISPLAY DEVICE

(71) Applicant: BOE TECHNOLOGY GROUP CO., LTD., Beijing (CN)

(72) Inventors: Nianqi Yao, Beijing (CN); Zhongpeng Tian, Beijing (CN); Ce Ning, Beijing (CN); Zhengliang Li, Beijing (CN); Hehe Hu, Beijing (CN); Jie Huang, Beijing (CN); Jiayu He, Beijing (CN); Feifei Li, Beijing (CN); Kun Zhao, Beijing (CN); Yimin Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 333 days.

(21) Appl. No.: 18/254,210

(22) PCT Filed: Apr. 21, 2022

(86) PCT No.: PCT/CN2022/088130
§ 371 (c)(1),
(2) Date: May 24, 2023

(87) PCT Pub. No.: WO2023/201618
PCT Pub. Date: Oct. 26, 2023

(65) Prior Publication Data
US 2024/0355978 A1    Oct. 24, 2024

(51) Int. Cl.
| | |
|---|---|
| *H10H 20/857* | (2025.01) |
| *G02F 1/13357* | (2006.01) |
| *H05K 3/46* | (2006.01) |

(52) U.S. Cl.
CPC ..... *H10H 20/857* (2025.01); *G02F 1/133603* (2013.01); *H05K 3/4688* (2013.01)

(58) Field of Classification Search
CPC ............ H10H 20/857; G02F 1/133603; G02F 1/133612; H05K 3/4688; H05K 3/4644;
(Continued)

(56) References Cited

U.S. PATENT DOCUMENTS

| | | |
|---|---|---|
| 6,519,845 B1 | 2/2003 | Cutting et al. |
| 6,620,720 B1 | 9/2003 | Moyer et al. |

(Continued)

FOREIGN PATENT DOCUMENTS

| | | |
|---|---|---|
| CN | 101452988 A | 6/2009 |
| CN | 202095173 U | 12/2011 |

(Continued)

OTHER PUBLICATIONS

Non-Final Office Action in U.S. Appl. No. 18/552,754, dated Mar. 12, 2025, in 10 pgs.
(Continued)

*Primary Examiner* — Patricia D Valenzuela
(74) *Attorney, Agent, or Firm* — Dority & Manning, P.A.

(57) ABSTRACT

A circuit board includes a substrate and a stress neutral layer disposed on a side of the substrate. The stress neutral layer includes one or more first metal layers and one or more second metal layers. The one or more second metal layers and the one or more first metal layers are stacked. At least one of the one or more first metal layers is made of a material for generating a tensile stress, and at least one of the one or more second metal layers is made of a material for generating a compressive stress.

20 Claims, 6 Drawing Sheets

(58) Field of Classification Search

CPC .......... H05K 2201/09136; H05K 1/09; H05K 1/0306; H05K 2201/0341; H05K 2201/10106; H05K 1/0271; H01L 25/0753; H01L 23/12

See application file for complete search history.

(56) References Cited

U.S. PATENT DOCUMENTS

| | | | |
|---|---|---|---|
| 8,354,009 | B2 | 1/2013 | Han et al. |
| 2002/0076911 | A1 | 6/2002 | Lin |
| 2003/0127701 | A1 | 7/2003 | Tiziani et al. |
| 2004/0166702 | A1 | 8/2004 | Higashi |
| 2006/0222821 | A1 | 10/2006 | Masai |
| 2007/0120233 | A1 | 5/2007 | Tellkamp |
| 2007/0122649 | A1 | 5/2007 | Lee et al. |
| 2007/0232051 | A1 | 10/2007 | Wang et al. |
| 2008/0081157 | A1 | 4/2008 | Schneegans et al. |
| 2008/0096015 | A1 | 4/2008 | Yan |
| 2008/0122086 | A1 | 5/2008 | Tsao et al. |
| 2008/0169539 | A1 | 7/2008 | Fang et al. |
| 2008/0202919 | A1* | 8/2008 | Han ........................ H05K 3/16 204/192.12 |
| 2008/0264681 | A1 | 10/2008 | Iwai et al. |
| 2009/0297879 | A1 | 12/2009 | Zeng et al. |
| 2010/0213608 | A1 | 8/2010 | Lau et al. |
| 2010/0301484 | A1 | 12/2010 | Bchir et al. |
| 2011/0006415 | A1 | 1/2011 | Bachman et al. |
| 2011/0062580 | A1 | 3/2011 | Liu et al. |
| 2011/0186872 | A1 | 8/2011 | Kim |
| 2011/0220940 | A1 | 9/2011 | Kim |
| 2013/0000978 | A1 | 1/2013 | Choi et al. |
| 2013/0107155 | A1 | 5/2013 | Guo et al. |
| 2013/0241058 | A1 | 9/2013 | Yu et al. |
| 2015/0099316 | A1 | 4/2015 | Ryu et al. |
| 2017/0250171 | A1 | 8/2017 | Yu et al. |
| 2017/0263645 | A1 | 9/2017 | Liu et al. |
| 2017/0358546 | A1 | 12/2017 | Shim et al. |
| 2019/0114957 | A1* | 4/2019 | Fan ........................... G09F 9/33 |
| 2019/0229446 | A1 | 7/2019 | Kim et al. |
| 2020/0035147 | A1 | 1/2020 | Ban et al. |
| 2020/0168461 | A1 | 5/2020 | Wang et al. |
| 2021/0043817 | A1 | 2/2021 | Liang et al. |
| 2021/0125566 | A1 | 4/2021 | Yang et al. |
| 2021/0143134 | A1 | 5/2021 | Wang |
| 2021/0223631 | A1 | 7/2021 | Ban et al. |
| 2021/0242146 | A1 | 8/2021 | Arvin et al. |
| 2021/0294158 | A1 | 9/2021 | Wang et al. |
| 2021/0358896 | A1 | 11/2021 | Lee et al. |
| 2021/0359182 | A1 | 11/2021 | Cao et al. |
| 2022/0181245 | A1 | 6/2022 | Ko et al. |
| 2024/0234658 | A1 | 7/2024 | He et al. |
| 2024/0260185 | A1 | 8/2024 | Zhang et al. |

FOREIGN PATENT DOCUMENTS

| | | | |
|---|---|---|---|
| CN | 202159705 | U | 3/2012 |
| CN | 102437135 | A | 5/2012 |
| CN | 103904172 | A | 7/2014 |
| CN | 104201121 | A | 12/2014 |
| CN | 104244566 | A | 12/2014 |
| CN | 104561943 | A | 4/2015 |
| CN | 104810457 | A | 7/2015 |
| CN | 105578709 | A | 5/2016 |
| CN | 206471352 | U | 9/2017 |
| CN | 107768343 | A | 3/2018 |
| CN | 109449087 | A | 3/2019 |
| CN | 110890323 | A | 3/2020 |
| CN | 210837765 | U | 6/2020 |
| CN | 111862886 | A | 10/2020 |
| CN | 112186079 | A | 1/2021 |
| CN | 112951791 | A | 6/2021 |
| CN | 113066834 | A | 7/2021 |
| CN | 113096549 | A | 7/2021 |
| CN | 113629079 | A | 11/2021 |
| CN | 113964112 | A | 1/2022 |
| CN | 113966076 | A | 1/2022 |
| CN | 114509884 | A | 5/2022 |
| CN | 114823608 | A | 7/2022 |
| EP | 2276063 | A2 | 1/2011 |
| JP | H08125310 | A | 5/1996 |
| JP | 2005322703 | A | 11/2005 |
| JP | 2009065116 | A | 3/2009 |
| JP | 2011159870 | A | 8/2011 |
| JP | 2014103143 | A | 6/2014 |
| JP | 2016146377 | A | 8/2016 |
| KR | 20130068112 | A | 6/2013 |
| KR | 20210038512 | A | 4/2021 |
| TW | 201345710 | A | 11/2013 |
| TW | 201417649 | A | 5/2014 |
| TW | 201520381 | A | 6/2015 |
| WO | WO2008092708 | A1 | 8/2008 |
| WO | WO2009145461 | A2 | 12/2009 |
| WO | WO2009145462 | A2 | 12/2009 |
| WO | WO2020153770 | A1 | 7/2020 |

OTHER PUBLICATIONS

PCT International Search Report (w/ English translation) and Written Opinion for corresponding PCT Application No. PCT/CN2022/088130, mailed Dec. 19, 2022, 10 pages.
Extended European Search Report for corresponding EP Application No. 21969681.2, dated Sep. 11, 2024, 11 pages.
Chinese Office Action (w/ English translation) for corresponding CN Application No. 202111239110.X, dated Nov. 22, 2024, 14 pages.
U.S. Non-Final Office Action received in corresponding U.S. Appl. No. 17/927,576, dated May 16, 2025, 16 pages.
U.S. Non-Final Office Action received in corresponding U.S. Appl. No. 17/927,792, dated Jul. 2, 2025, 19 pages.
U.S. Notice of Allowance received in corresponding U.S. Appl. No. 18/552,754, dated Jul. 2, 2025, 8 pages.
PCT International Search Report and Written Opinion (w/ English translation) for corresponding PCT Application No. PCT/CN2022/128740, dated Jul. 3, 2023, 13 pages.
PCT International Search Report and Written Opinion (w/ English translation) for corresponding PCT Application No. PCT/CN2021/142667, dated Aug. 12, 2022, 16 pages.
PCT International Search Report and Written Opinion (w/ English translation) for corresponding PCT Application No. PCT/CN2021/143613, dated Oct. 9, 2022, 16 pages.
PCT International Search Report and Written Opinion (w/ English translation) for corresponding PCT Application No. PCT/CN2022/077542, dated Oct. 10, 2022, 16 pages.
Taiwanese Office Action (w/ English translation) for corresponding TW Application No. 111141791, dated Aug. 2, 2023, 37 pages.
Extended European Search Report in corresponding EP Application No. 22937855.9, dated Feb. 19, 2025, in 7 pgs.
Non-Final Office Action in U.S. Appl. No. 18/552,754, dated Sep. 27, 2023, in 10 pgs.
Chinese First Office Action (with English translation) for corresponding Application No. CN 202180004327.4, dated Sep. 18, 2025, 20 pages.
Jin-Du, "The brief summary of the finish in PCB soldered tray", (with English translation), Printed Circuit Information, Issue 8, 2016, pp. 30-34.
Japanese Office Action (with English translation) for corresponding Application No. JP2023579657, dated Nov. 11, 2025, 20 pages.

* cited by examiner

CIRCUIT BOARD, LIGHT-EMITTING SUBSTRATE, BACKLIGHT MODULE, DISPLAY PANEL AND DISPLAY DEVICE

CROSS-REFERENCE TO RELATED APPLICATION

This application is a national phase entry under 35 USC 371 of International Patent Application No. PCT/CN 2022/ 088130 filed on Apr. 21, 2022, which is incorporated herein by reference in its entirety.

TECHNICAL FIELD

The present disclosure relates to the field of display technologies, and in particular, to a circuit board, a light-emitting substrate, a backlight module, a display panel and a display device.

BACKGROUND

A mini light-emitting diode (Mini LED) refers to a light-emitting diode (LED) device with a die size between 50 μm and 200 μm. A die size of a Mini LED is less than a die size of a traditional LED and is greater than a die size of a micro light-emitting diode (Micro LED), and a dot pitch between Mini LEDs is less than a dot pitch between traditional LEDs and is greater than a dot pitch between Micro LEDs. Mini light-emitting diodes are widely applied to backlight and display screens.

SUMMARY

In an aspect, a circuit board is provided. The circuit board includes a substrate and a stress neutral layer disposed on a side of the substrate. The stress neutral layer includes one or more first metal layers and one or more second metal layers. The one or more second metal layers and the one or more first metal layers are stacked. At least one of the one or more first metal layers is made of a material for generating a tensile stress, and at least one of the one or more second metal layers is made of a material for generating a compressive stress.

In some embodiments, the number of the at least one first metal layer is more than one, and the number of the at least one second metal layer is more than one. At least one second metal layer is located between two first metal layers, and at least one first metal layer is located between two second metal layers.

In some embodiments, a sum of thicknesses of all first metal layers of the one or more first metal layers accounts for 70% to 99% of a thickness of the stress neutral layer.

In some embodiments, a warpage amount of the stress neutral layer is less than or equal to 1 mm.

In some embodiments, a material of a second metal layer in the at least one second metal layer includes any one of W, WNi, WCu, WMo, WCr and WAl.

In some embodiments, a resistance of the second metal layer is in a range of $1 \times 10^{-8}$ Ω·m to $1 \times 10^{-5}$ Ω·m, inclusive.

In some embodiments, the material of the at least one first metal layer includes copper.

In some embodiments, the at least one of the one or more first metal layers further includes at least one buffer layer.

In some embodiments, a material of a buffer layer includes any one of MoNb, MoNiTi, Ti, Mo and MoTi.

In some embodiments, a thickness of a buffer layer is in a range of 0 angstroms to 1000 angstroms, inclusive.

In some embodiments, a thickness of each first metal layer is in a range of 1 μm to 3 μm, inclusive, and a thickness of each second metal layer is in a range of 300 angstroms to 5000 angstroms, inclusive.

In some embodiments, a first metal layer in the at least one first metal layer closest to the substrate includes a copper layer and at least one buffer layer, and one of the at least one buffer layer is closer to the substrate than the copper layer.

In some embodiments, the substrate is a glass substrate.

In some embodiments, the stress neutral layer includes a plurality of patterns formed by etching, and each pattern of the plurality of patterns includes sub-patterns respectively formed by stacked layers. In a case where the stress neutral layer includes a plurality of first metal layers and the at least one second metal layer, in the pattern, a slope angle of a sub-pattern formed by a stacked layer farther from the substrate is less than a slope angle of a sub-pattern formed by a stacked layer closer to the substrate. A stacked layer in the stacked layers is any one of a portion of a first metal layer, a portion of a second metal layer, or a portion of a combination film layer of a first metal layer and a second metal layer that are adjacent to each other.

In some embodiments, a slope angle of any sub-pattern in the pattern is in a range of 20° to 70°, inclusive.

In another aspect, a light-emitting substrate is provided. The light-emitting substrate includes the above circuit board. The stress neutral layer is used for forming wirings and/or electrode pads.

In some embodiments, the light-emitting substrate further includes a plurality of light-emitting devices. A light-emitting device includes a first pin and a second pin, the electrode pads include first electrode pads and second electrode pads, and the wirings include first wirings and second wirings. A first wiring is connected to the first pin of the light-emitting device through a first electrode pad, and a second wiring is connected to the second pin of the light-emitting device through a second electrode pad.

In some embodiments, the electrode pads are made of one of WNi and WCu.

In some embodiments, the light-emitting device is a sub-millimeter light-emitting diode or a micro light-emitting diode.

In yet another aspect, a backlight module is provided. The backlight module includes the above light-emitting substrate.

In yet another aspect, a display device is provided. The display device includes the above backlight module. The display device further includes a liquid crystal display panel connected to the backlight module.

In yet another aspect, a display panel is provided. The display panel includes the above light-emitting substrate.

In yet another aspect, a display device is provided. The display device includes the above display panel.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1:
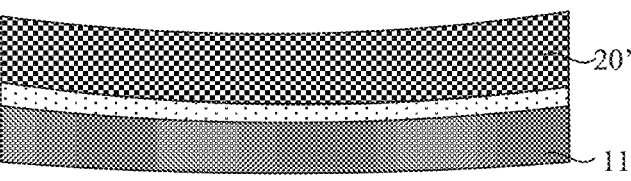
FIG. 1 is a structural diagram of a circuit board.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both include following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

As used herein, the term such as "parallel," "perpendicular" or "equal" includes a stated condition and condition(s) similar to the stated condition. The similar condition(s) are within an acceptable range of deviation as determined by a person of ordinary skill in the art, considering measurement in question and errors associated with measurement of a particular quantity (i.e., limitations of a measurement system). For example, the term "parallel" includes "absolutely parallel" and "approximately parallel", and for the phrase "approximately parallel", an acceptable range of deviation may be, for example, within 5°. The term "perpendicular" includes "absolutely perpendicular" and "approximately perpendicular", and for the phrase "approximately perpendicular", an acceptable range of deviation may also be, for example, within 5°. The term "equal" includes "absolutely equal" and "approximately equal", and for the phrase "approximately equal", an acceptable range of deviation may be that, for example, a difference between two that are equal to each other is less than or equal to 5% of any one of the two.

It will be understood that when a layer or element is described as being on another layer or substrate, the layer or element may be directly on the another layer or substrate, or intermediate layer(s) may exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

An electrical signal is transmitted to an electronic element by a conductive line, so that a voltage drop loss due to the conductive line needs to be reduced as much as possible. According to the resistance calculation formula, a resistance of the conductive line is related to a resistivity of a conductive material that is used, a length of the conductive line in an extending direction thereof, and an area of a cross-section of the conductive line taken along a direction perpendicular to the extending direction. The area of the cross-section is determined by a line width and a line height (i.e., thickness). Since a wiring space of a display panel is determined, and two adjacent conductive lines need to meet an electrical reliability requirement, a line spacing between any two adjacent conductive lines has a minimum value. Thus, the line width of the conductive line has a design limit. In order to reduce the resistance of the conductive line as much as possible, the line height of the conductive line may be increased as much as possible. On another hand, a conductive material with a low resistivity should be selected. Taking cost into account, copper is currently the best choice. That is, a conductive line with a low resistance is realized by manufacturing a copper conductive line with a large thickness, i.e., manufacturing a thick copper conductive line.

A metal layer may be manufactured by an electroplating process or a magnetron sputtering process.

The electroplating process has problems of high cost, serious pollution and poor film quality. Specific problems are as follows: (1) firstly, a substrate is placed into a sputtering chamber to form a seed layer thereon, and then is placed into an electroplating equipment for deposition of a metal coating, so that the substrate needs to be placed into different process chambers, which results in an increase of an overall process time; (2) the electroplating process involves chemical reactions, and hazardous wastes exist, which results in serious pollution to the environment; (3) the formed coating is poor in compactness and poor in surface flatness. Moreover, since electroplating is a liquid phase film forming process through electrochemical reactions, and there are many byproducts, the substrate is easily oxidized after being taken out from the electroplating equipment, which results in a dirty surface of the coating.

Figure 2:
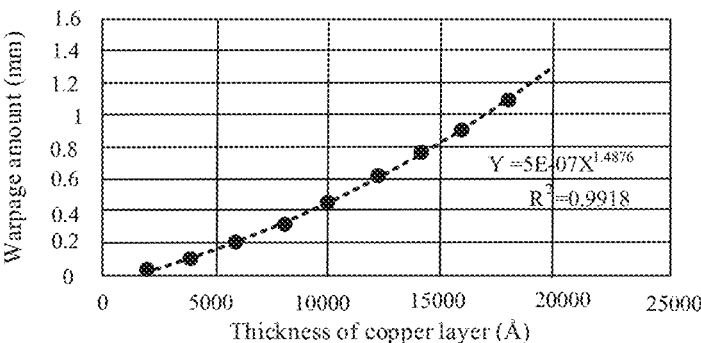
FIG. 2 is a graph showing a variation of a stress (i.e., warpage amount) of a copper layer with a thickness.

As shown in FIGS. 1 and 2, a metal layer 20' formed by a magnetron sputtering process has advantages of good film uniformity and high compactness. However, due to high energy of plasma and a fast deposition speed in the sputtering process, a substrate 11 made of a temperature-sensitive material (e.g., glass) is rapidly heated. The metal plasma is different from the substrate 11 in thermal expansion coefficient to generate a large thermal stress, and the thermal stress has a positive correlation with a thickness. When a stress of a metal coating is large, the substrate 11 is prone to warping or even cracking. Therefore, manufacturing the metal layer 20' with a large thickness (e.g., over 2 μm) on the substrate 11 by the sputtering process currently involves many risks. It will be noted that warpage means that a material is not shaped as designed, so that the material is shaped into a distorted shape.

Figure 3:
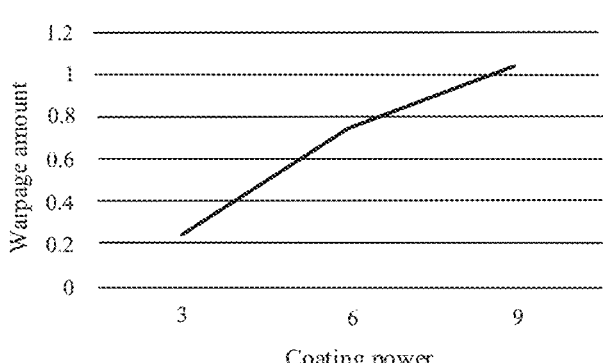
FIG. 3 is a graph showing a variation of a warpage amount with a coating power of a magnetron sputtering process.

As shown in FIG. 3, the stress of the metal coating may be reduced by reducing a coating power (for example, a warpage amount is prevented from being greater than 2 mm). However, a film forming efficiency is reduced, thereby affecting a production efficiency.

A mini light-emitting diode (Mini LED) is also referred to as a sub-millimeter light-emitting diode, and refers to an LED with a die size of about 80 μm to 500 μm. A die size of a Mini LED is between a die size of a traditional fine pitch LED and a die size of a Micro LED, and a dot pitch between Mini LEDs is between a dot pitch between traditional fine pitch LEDs and a dot pitch between Micro LEDs.

For the application of the Mini LEDs in backlight, a plurality of Mini LEDs arranged in an array are used as backlight, and at least one Mini LED is used as a partition and is matched with a liquid crystal display (LCD) to realize local dimming in a small range, which is able to realize better brightness uniformity and higher color contrast within a smaller light mixing distance, thereby achieving ultra-thin, high color rendering and power saving performances of a terminal product, compared with a traditional backlight design. Moreover, since the design is able to be matched with a flexible substrate in cooperation with a curved surface of the liquid crystal display (LCD), a curved surface display similar to an organic light-Emitting diode (OLED) is able to be realized in a case of ensuring an image quality.

For the application of the Mini LEDs on the display screen, RGB Mini LEDs overcome wire bonding and reliability defects of front-mounted chips, while combining advantages of chip on board (COB refers to fixing an IC on a printed circuit board), so that a dot pitch of the display screen is further reduced. Visual effects of a corresponding terminal product are greatly improved, and a viewing distance is able to be greatly reduced. On another hand, the use of the RGB Mini LEDs with a flexible substrate enables high image quality display effects of a curved surface display to be realized, and the RGB Mini LEDs with self-luminous characteristics have a wider application field, e.g., automobile display.

For a high resolution product in which the Mini LEDs are used, since the Mini LED is a current component that needs to exhibit a stable photoelectric property under a large current, it is still difficult to meet the requirements by using the metal layer 20' with the thickness of 2 μm to manufacture the conductive line.

Figure 4:
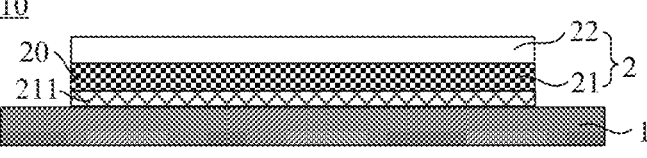
FIG. 4 is a structural diagram of a circuit board, in accordance with some embodiments of the present disclosure.
Figure 5:
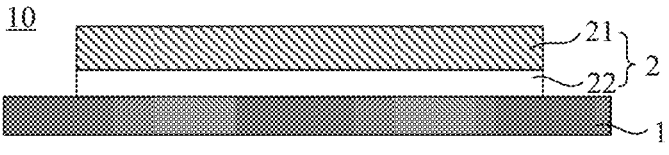
FIG. 5 is a structural diagram of another circuit board, in accordance with some embodiments of the present disclosure.
Figure 6:
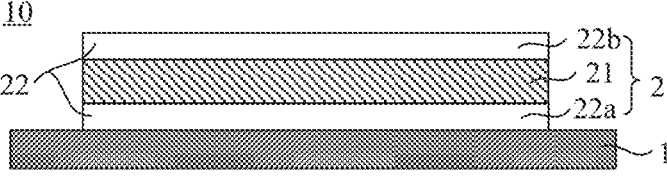
FIG. 6 is a structural diagram of yet another circuit board, in accordance with some embodiments of the present disclosure.

Based on the above, the present disclosure provides a circuit board 10. As shown in FIGS. 4, 5 and 6, the circuit board 10 includes a substrate 1 and a stress neutral layer 2 disposed on a side of the substrate 1. The stress neutral layer 2 includes at least one first metal layer 21 and at least one second metal layer 22 that are stacked. Moreover, at least one of the at least one first metal layer 21 is made of a material for generating a tensile stress, and at least one of the at least one second metal layer 22 is made of a material for generating a compressive stress.

For example, the substrate 1 includes any one of, for example, a glass substrate, a quartz substrate, a sapphire substrate and a ceramic substrate, or any one of a semiconductor substrate such as a monocrystalline semiconductor substrate or a polycrystalline semiconductor substrate made of silicon or silicon carbide, a compound semiconductor substrate such as silicon germanium, and a silicon on insulator (SOI) substrate. The substrate may further include an organic resin material such as epoxy, triazine, silicone, or polyimide. In some exemplary embodiments, the substrate may be an FR4 printed circuit board (PCB), or may be a flexible PCB that is easily deformable. In some exemplary embodiments, the substrate may include any one of a ceramic material such as silicon nitride, AlN or $Al_2O_3$, or a metal or metal compound, or a metal core printed circuit board (MCPCB), or a metal base copper clad laminate (MCCL).

It will be noted that the first metal layer 21 is made of the material for generating the tensile stress, which means that after the material of the first metal layer 21 forms a film layer, a warpage amount generated by the first metal layer 21 has a positive value. The second metal layer 22 is made of the material for generating the compressive stress, which means that after the material of the second metal layer 22 forms a film layer, a warpage amount generated by the second metal layer 22 has a negative value. The warpage amount of the first metal layer 21 has the positive value, and the warpage amount of the second metal layer 22 has the negative value, which means that the first metal layer 21 and the second metal layer 22 have acting forces to generate warpages in opposite directions.

Figure 7:
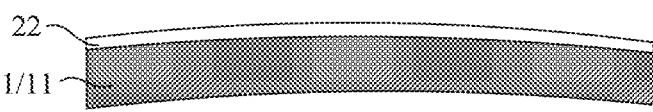
FIG. 7 is a diagram showing a stressed structure of a second metal layer, in accordance with some embodiments.
Figure 8:
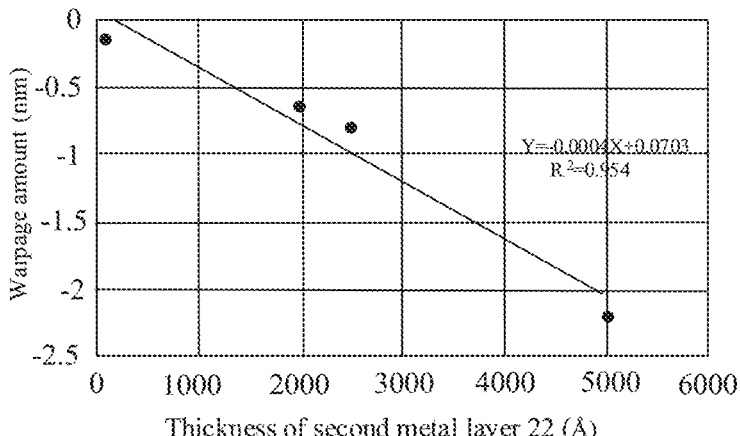
FIG. 8 is a graph showing a variation of a stress (i.e., warpage amount) of a second metal layer with a thickness, in accordance with some embodiments of the present disclosure.

For example, referring to FIGS. 1 and 2 again, the material of the first metal layer 21 is, for example, copper, and an upward warpage is generated. As shown in FIGS. 7 and 8, after the second metal layer 22 is formed, a downward warpage is generated. Then, the structure shown in FIG. 1 and the structure shown in FIG. 7 have acting forces to generate warpages in opposite directions.

For example, the at least one first metal layer 21 and the at least one second metal layer 22 constitute the stress neutral layer 2. Referring to FIGS. 4 and 5 again, the at least one first metal layer 21 is singular in number, the at least one second metal layer 22 is singular in number, and the stress neutral layer 2 means that the compressive stress generated by the second metal layer 22 effectively counteracts the tensile stress generated by the first metal layer 21.

For example, a thickness of the first metal layer 21 is 3 μm, and the warpage amount generated by the first metal layer 21 is 1.3 mm. A thickness of the second metal layer 22 is 2000 angstroms (Å), and the warpage amount generated by the second metal layer 22 is-0.65 mm. Then, a theoretical value of a warpage amount of the stress neutral layer 2 formed after the first metal layer 21 and the second metal layer 22 are stacked is a sum of the warpage amount of the first metal layer 21 and the warpage amount of the second metal layer 22, i.e., is 0.65 mm (i.e., 1.3 mm–0.65 mm=0.65 mm). An actual measured warpage amount of the substrate 1, the first metal layer 21 and the second metal layer 22 that are stacked in sequence is 0.63 mm, and an actual measured warpage amount of the substrate 1, the second metal layer 22 and the first metal layer 21 that are stacked in sequence is 0.6 mm. A difference between the actual measured value and the theoretical calculated value is small.

It will be noted that, as shown in FIG. 4, the substrate 1, the first metal layer 21 and the second metal layer 22 are stacked in sequence. As shown in FIG. 5, the substrate 1, the second metal layer 22 and the first metal layer 21 are stacked in sequence. Here, in a direction away from the substrate 1, the stacking sequence of the second metal layer 22 and the first metal layer 21 is not limited.

In some examples, the at least one first metal layer includes M layers, and the at least one second metal layer includes N layers, in which |M–N|≤2. Of course, in some examples, the number of the first metal layer(s) and the number of the second metal layer(s) may be not necessarily related.

In some examples, referring to FIG. 6 again, the at least one first metal layer 21 is singular in number, and the at least one second metal layer 22 is dual in number, i.e., a second metal layer 22a and a second metal layer 22b. The substrate 1, the second metal layer 22a, the first metal layer 21 and the second metal layer 22b are stacked in sequence.

For example, the thickness of the first metal layer 21 is 3 μm, and the warpage amount generated by the first metal layer 21 is 1.3 mm. The thickness of each second metal layer 22 is 2000 angstroms (Å), and the warpage amount generated by each second metal layer 22 is –0.65 mm. Then, the warpage amount of the stress neutral layer 2 formed after the first metal layer 21 and the two second metal layers 22 are stacked is a sum of the warpage amount of the first metal layer 21 and the warpage amount of the two second metal layers 22, i.e., has a theoretical value 0 mm (i.e., 1.3 mm–0.65 mm–0.65 mm=0 mm). An actual measured warpage amount is –0.1 mm, and a difference between the actual measured value and the theoretical calculation value is small.

The first metal layer(s) 21 for generating the tensile stress and the second metal layer(s) 22 for generating the compressive stress are formed on the substrate 1, so that the warpage forces generated by the first metal layer(s) 21 and the second metal layer(s) 22 are neutralized. For example, the stress generated by the copper material is the tensile stress, and the stress generated by the second metal layer(s) 22 is the compressive stress, so that the second metal layer(s) 22 may effectively eliminate the tensile stress generated by the copper material to form the stress neutral layer 2, which may effectively avoid cracking and other defects of the substrate 1 caused by a warpage of a metal layer with a large thickness by using a magnetron sputtering process.

In some embodiments, as shown in FIGS. 9 to 13, the at least one first metal layer 21 is plural in number, and the at least one second metal layer 22 is plural in number. At least one second metal layer 22 is located between two first metal layers 21, and at least one first metal layer 21 is located between two second metal layers 22. That is, the first metal layers 21 and the second metal layers 22 are alternately arranged.

It will be noted that, in a case where the at least one first metal layer 21 is plural in number and the at least one second metal layer 22 is plural in number, the first metal layers 21 and the second metal layers 22 are alternately arranged, which means that the first metal layer 21, the second metal layer 22, the first metal layer 21, the second metal layer 22, the first metal layer 21, the second metal layer 22, etc., are stacked in sequence in the direction away from the substrate 1; or the second metal layer 22, the first metal layer 21, the second metal layer 22, the first metal layer 21, the second metal layer 22, the first metal layer 21, etc., are stacked in sequence in the direction away from the substrate 1. That is, a single first metal layer 21 and a single second metal layer 22 are repeatedly arranged.

Alternatively, the first metal layers 21 and the second metal layers 22 are alternately arranged, which means that the first metal layer 21, the first metal layer 21, the second metal layer 22, the first metal layer 21, the first metal layer 21, the second metal layer 22, etc., are stacked in sequence in the direction away from the substrate 1; or the second metal layer 22, the first metal layer 21, the first metal layer 21, the second metal layer 22, the first metal layer 21, the first metal layer 21, the second metal layer 22, the first metal layer 21, the first metal layer 21, etc., are stacked in sequence in the direction away from the substrate 1. That is, two first metal layers 21 and a single second metal layer 22 are repeatedly arranged.

Alternatively, the first metal layers 21 and the second metal layers 22 are alternately arranged, which means that the first metal layer 21, the first metal layer 21, the second metal layer 22, the first metal layer 21, the second metal layer 22, etc., are stacked in sequence in the direction away from the substrate 1. Alternatively, the second metal layer 22, the first metal layer 21, the second metal layer 22, the first metal layer 21, the first metal layer 21, the second metal layer 22, the first metal layer 21, the second metal layer 22, etc., are stacked in sequence in the direction away from the substrate 1. That is, two first metal layers 21 or a single first metal layer 21 and a single second metal layer 22 are alternately arranged.

That is, in a case where the first metal layers 21 and the second metal layers 22 are alternately arranged, there may be a single first metal layer 21 or two first metal layers 21 between two second metal layers 22, which is not limited herein, and other embodiments of the present disclosure are similar thereto.

Figure 9:
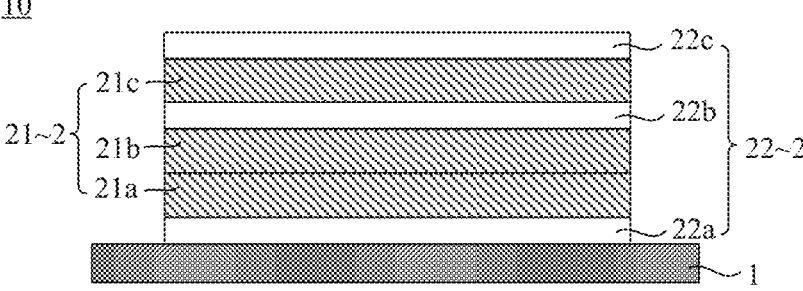
FIG. 9 is a structural diagram of yet another circuit board, in accordance with some embodiments of the present disclosure.

In some examples, as shown in FIG. 9, the at least one first metal layer 21 includes three first metal layers 21, and the three first metal layers 21 are respectively a first metal layer 21_a_, a first metal layer 21_b_ and a first metal layer 21_c_. The at least one second metal layer 22 includes three second metal layers 22, and the three second metal layers 22 are respectively a second metal layer 22_a_, a second metal layer 22_b_ and a second metal layer 22_c_. The second metal layer 22_a_, the first metal layer 21_a_, the first metal layer 21_b_, the second metal layer 22_b_, the first metal layer 21_c_ and the second metal layer 22_c_ stacked in sequence in the direction away from the substrate 1.

Figure 10A:
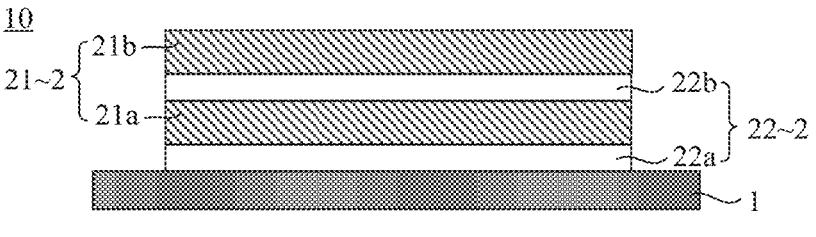
FIG. 10a is a structural diagram of yet another circuit board, in accordance with some embodiments of the present disclosure.
Figure 10B:
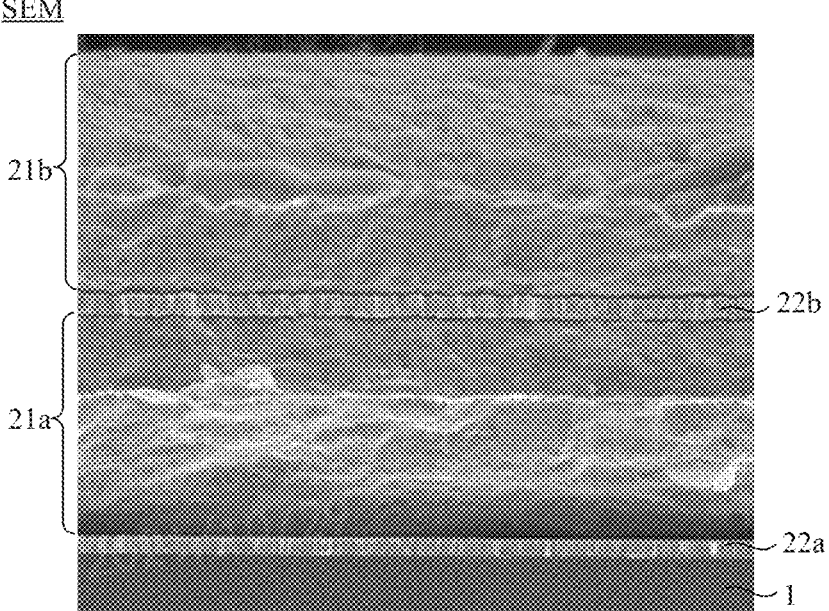
FIG. 10b is a scanning electron microscope (SEM) image of a circuit board, in accordance with some embodiments of the present disclosure.

In some examples, as shown in FIG. 10_a_, the at least one first metal layer 21 includes two first metal layers 21, and the two first metal layers 21 are respectively a first metal layer 21_a_ and a first metal layer 21_b_. The at least one second metal layer 22 includes two second metal layers 22, and the two second metal layers 22 are respectively a second metal layer 22_a_ and a second metal layer 22_b_. The second metal layer 22_a_, the first metal layer 21_a_, the second metal layer 22_b_ and the first metal layer 21_b_ are stacked in sequence in the direction away from the substrate 1.

Figure 11:
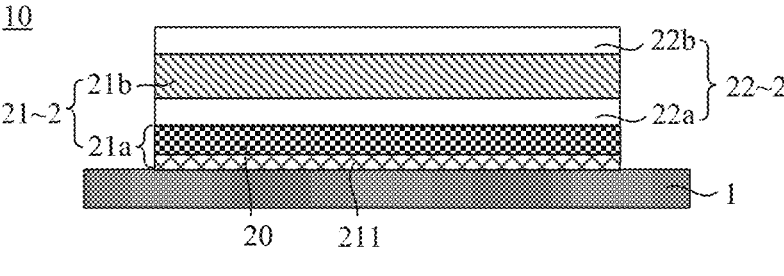
FIG. 11 is a structural diagram of yet another circuit board, in accordance with some embodiments of the present disclosure.

In some examples, as shown in FIG. 11, in a case where the at least one first metal layer 21 includes the two first metal layers 21 and the at least one second metal layer 22 includes the two second metal layers 22, the first metal layer 21_a_, the second metal layer 22_a_, the first metal layer 21_b_ and the second metal layer 22_b_ may be stacked in sequence in the direction away from the substrate 1, which is not limited herein.

Figure 12:
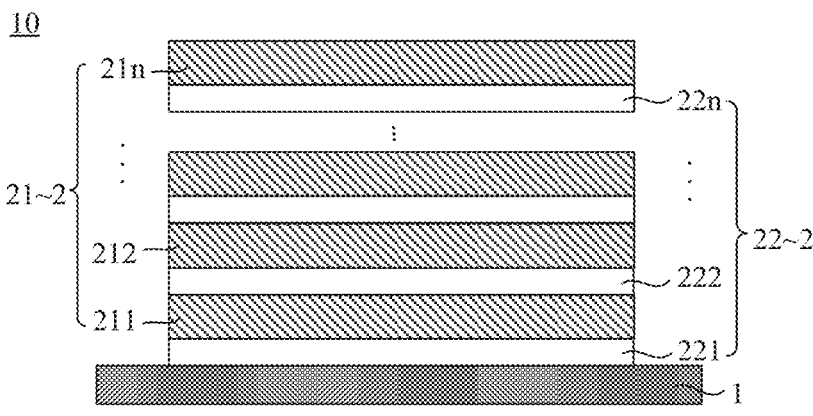
FIG. 12 is a structural diagram of yet another circuit board, in accordance with some embodiments of the present disclosure.

In some examples, as shown in FIG. 12, the at least one first metal layer 21 includes n first metal layers 21, and the n first metal layers 21 are respectively a first metal layer 211, a first metal layer 212 . . . a first metal layer 21_n_. The at least one second metal layer 22 includes n second metal layers 22, and the n second metal layers 22 are respectively a second metal layer 221, a second metal layer 222 . . . a second metal layer 22_n_. The second metal layer 221, the first metal layer 211, the second metal layer 222, the first metal layer 212 . . . the second metal layer 22_n_ and the first metal layer 21_n_ are stacked in sequence in the direction away from the substrate 1, in which n is a positive integer greater than or equal to 1.

Figure 13:
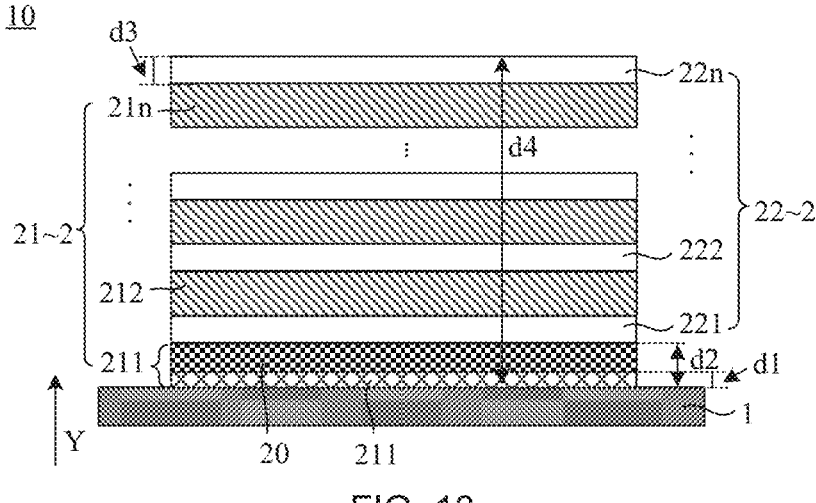
FIG. 13 is a structural diagram of yet another circuit board, in accordance with some embodiments of the present disclosure.

In some examples, as shown in FIG. 13, in a case where the at least one first metal layer 21 includes the n first metal layers 21 and the at least one second metal layer 22 includes the n second metal layers 22, the first metal layer 211, the second metal layer 221, the first metal layer 212, the second metal layer 222 . . . the first metal layer 21_n_ and the second metal layer 22_n_ may be stacked in sequence in the direction away from the substrate 1, which is not limited herein.

The stress neutral layer 2 is arranged to include a plurality of first metal layers 21 and a plurality of second metal layers 22, so that an overall thickness of the first metal layers 21 may be increased. For example, the first metal layers 21 in the stress neutral layer 2 include two layers spaced apart from each other, the thickness of the first metal layers 21 is a sum of thicknesses of the two layers, thereby increasing the thickness of the first metal layers 21 in a case of ensuring a small warpage.

For example, as shown in FIGS. 4 and 5, the stress neutral layer 2 includes a single first metal layer 21, and a thickness of the first metal layer 21 is in a range of 1 μm to 3 μm, inclusive. Although the thickness of the first metal layer 21 is less than 5 μm, the stress neutral layer 2 in which the first metal layer 21 is located has a small warpage amount such as 0.6 mm or 0.63 mm as described above.

For example, as shown in FIG. 6, the stress neutral layer 2 includes a single first metal layer 21, and a thickness of the first metal layer 21 is in a range of 1 μm to 4 μm, inclusive. A warpage amount of the first metal layer 21 may be, for example, −0.1 mm or 0.6 mm.

For example, as shown in FIGS. 10_a_ and 11, the first metal layers 21 in the stress neutral layer 2 include two layers spaced apart from each other, and the thickness of the first metal layers 21 is a sum of a thickness of a first metal layer 21_a_ and a thickness of a first metal layer 21_b_. The overall thickness of the formed first metal layers 21 is in a range of 1 μm to 6 μm, inclusive, and a warpage amount of the first metal layers 21 may be, for example, 0.6 mm, 0.65 mm or 1 mm.

For example, as shown in FIGS. 12 and 13, the first metal layers 21 in the stress neutral layer 2 include two layers spaced apart from each other, and the thickness of the first metal layers 21 is a sum of a thickness of a first metal layer 211 and a thickness of a first metal layer 212. The overall thickness of the formed first metal layers 21 is in a range of 1 μm to 6 μm, inclusive, and a warpage amount of the first metal layers 21 may be, for example, 0.6 mm, or 0.65 mm. Therefore, it is possible to form the first metal layers 21 with a large thickness in a case of ensuring a small warpage.

In some examples, FIG. 10_b_ is an SEM image of the circuit board including two first metal layers 21 and two second metal layers 22. It can be seen that a flatness of each layer is good; the first metal layer 21 and the second metal layer 22 adjacent to each other have a clear interface without obvious peeling and with good adhesion, and the second metal layer 22 and the substrate 1 have a clear interface without obvious peeling and with good adhesion.

In some embodiments, as shown in FIG. 13, a sum of thicknesses d2 of all first metal layers 21 of the at least one first metal layer 21 accounts for 70% to 99% of the thickness d4 of the stress neutral layer 2.

For example, the sum of the thicknesses d2 of all the first metal layers 21 accounts for 70%, 75%, 80%, 86%, 95% or 99% of the thickness d4 of the stress neutral layer 2, which is not limited herein.

In some embodiments, the warpage amount of the stress neutral layer 2 is less than or equal to 1 mm (i.e., ≤1 mm).

The at least one first metal layer 21 with the tensile stress and the at least one second metal layer 22 with the compressive stress constitute the stress neutral layer 2, and the material and thickness of the at least one first metal layer 21 and the material and thickness of the at least one second metal layer 22 are controlled, so that the stress neutral layer 2 with the warpage amount of less than or equal to 1 mm may be formed, which may effectively avoid the cracking and other defects of the substrate 1 caused by an excessive warpage. The material and thickness of the at least one first metal layer 21 and the material and thickness of the at least one second metal layer 22 in the stress neutral layer 2 will be specified below, and will not be repeated here.

In some embodiments, the material of the second metal layer 22 includes any one of W, WNi, WCu, WMo, WCr and WAl.

For example, the material of the second metal layer 22 may be chosen from tungsten (W) or a tungsten nickel alloy (WNI), a tungsten copper alloy (WCu), a tungsten molybdenum alloy (WMo), a tungsten chromium alloy (WCr), a tungsten aluminum alloy (WAl).

For example, in a case where the material of the second metal layer 22 is W, a relationship between the thickness and the warpage amount of the second metal layer 22 is shown in the curve in FIG. 8. It can be seen that the warpage amount of the second metal layer 22 has a negative value, and the warpage amount of the second metal layer 22 decreases as the thickness of the second metal layer 22 increases.

In some embodiments, a resistance of the second metal layer 22 is in a range of $1 \times 10^{-8}$ Ω·m to $1 \times 10^{-5}$ Ω·m, inclusive. The second metal layer 22 is a conductor, and in a case where the first metal layer(s) 21 and the second metal layer(s) 22 are stacked to form a conductive line, after the stacked structure of the first metal layer(s) 21 (copper) and the second metal layer(s) 22 (tungsten) is formed, a resistance of the stacked structure is less than a resistance of the first metal layer(s) 21 (i.e., copper layer(s)) alone, and an electrical conductivity of the stacked structure meets requirements of use.

In some embodiments, as shown in FIG. 13, the material of the first metal layer 21 includes copper.

The material of the first metal layer 21 includes copper, so as to form the conductive line made of copper to which an electrical signal is transmitted, thereby meeting requirements of a current drive of the Mini LED.

It will be noted that a film layer made of copper in the first metal layer 21 is referred to as a copper layer 20.

In some embodiments, as shown in FIG. 13, the at least one of the at least one first metal layer 21 further includes at least one buffer layer 211. That is, the at least one first metal layer 21 includes the copper layer 20 and the at least one buffer layer 211, and the at least one buffer layer is located on at least one side of the copper layer 20.

For example, referring to FIG. 13 again, the first metal layer(s) 21 include the plurality of first metal layers 21, which are respectively the first metal layer 211, the first metal layer 212 . . . the first metal layer 21n. The first metal layer 211 is a film layer closest to the substrate 1. The first metal layer 211 includes the copper layer 20 and the at least one buffer layer 211, and the included buffer layer(s) 211 is singular in number. The buffer layer 211 and the copper layer 20 are stacked, and the buffer layer 211 may be closer to the substrate 1 than the copper layer 20. There may be a plurality of buffer layers 211 included in the first metal layer 211, which is not limited herein.

In some embodiments, a material of the buffer layer 211 includes any one of MoNb, MoNiTi, Ti, Mo and MoTi.

For example, the material of the buffer layer 211 may be a molybdenum niobium alloy (MoNb), a molybdenum nickel titanium alloy (MoNiTi), titanium (Ti), molybdenum (Mo), or a molybdenum titanium alloy (MoTi).

As shown in FIG. 13, the buffer layer(s) 211 are disposed on a side of the copper layer 20, so that adhesion between the first metal layer 21 and a layer adjacent to the first metal layer 21 may be increased, and the layer adjacent to the first metal layer 21 may be the substrate 1 or the second metal layer 22.

In some embodiments, referring to FIG. 13 again, a thickness d1 of the buffer layer 211 is in a range of 0 angstroms (Å) to 1000 angstroms (Å), inclusive.

A thickness of a film layer refers to an average value of dimensions of the film layer in a first direction Y perpendicular to the substrate 1, and the same for the above and following thicknesses.

It will be noted that the thickness d1 of the buffer layer 211 is 0 angstroms, which will be understood that the buffer layer 211 may not be disposed, and the first metal layer 21 includes only the copper layer. In a case where the buffer layer(s) 211 are disposed, for example, the thickness of the buffer layer 211 is 100 angstroms, 300 angstroms, 600 angstroms, 800 angstroms, or 1000 angstroms, which is not limited herein.

In some embodiments, referring to FIG. 13 again, the thickness d2 of each first metal layer 21 is in a range of 1 μm to 3 μm, inclusive. The thickness d3 of each second metal layer is in a range of 300 angstroms to 5000 angstroms, inclusive.

For example, the first metal layer 21 is formed by a magnetron sputtering process.

For example, the thickness d2 of the first metal layer 21 is 1 μm, 1.5 μm, 2 μm, or 3 μm, which is not limited herein.

For example, the second metal layer 22 is formed by a magnetron sputtering process.

For example, the thickness d3 of the second metal layer 22 is 300 angstroms, 1000 angstroms, 1500 angstroms, 3000 angstroms, 3500 angstroms, 4000 angstroms, or 5000 angstroms, which is not limited herein.

In some embodiments, referring to FIG. 4 again, in a case where the first metal layer 21 is closest to the substrate 1, the first metal layer 21 includes a copper layer 20 and at least one buffer layer 211, and one of the at least one buffer layer 211 is closer to the substrate 1 than the copper layer 20.

In some examples, as shown in FIG. 4, the substrate 1, the first metal layer 21 and the second metal layer 22 are arranged in sequence, and in this case, the first metal layer 21 is arranged closest to the substrate 1, the first metal layer 21 includes the copper layer 20 and a single buffer layer 211, and the buffer layer 211 is closer to the substrate 1 than the copper layer 20. The buffer layer 211 may increase the adhesion between the copper layer 20 and the substrate 1, thereby improving the structural stability.

In some examples, as shown in FIG. 11, the substrate 1, the first metal layer 21a, the second metal layer 22a, the first metal layer 21b and the second metal layer 22b are stacked in sequence. As shown in FIG. 13, the substrate 1, the first metal layer 211, the second metal layer 221, the first metal layer 212, the second metal layer 222 . . . the first metal layer 21$n$ and the second metal layer 22$n$ are stacked in sequence, and the first metal layer 211 is arranged closest to the substrate 1. Then, the first metal layer 21$a$ or the first metal layer 211 includes a copper layer 20 and a buffer layer 211, and the buffer layer 211 is closer to the substrate 1 than the copper layer 20. A first metal layer 21 farther from the substrate 1, e.g., the first metal layer 21$b$, may include a buffer layer 211, or may not include a buffer layer 211, which is not limited herein.

In some examples, as shown in FIG. 12, the second metal layer 221, the first metal layer 211, the second metal layer 222, the first metal layer 212 . . . the second metal layer 22$n$ and the first metal layer 21$n$ are stacked on the substrate 1 in sequence. Since the second metal layer 221 is closest to the substrate 1, the first metal layer 211 may not be provided with a buffer layer 211, so that not only the process may be simplified, but also the process cost may be reduced.

In some embodiments, the substrate 1 is a glass substrate. That is, the substrate 1 is the above glass substrate 11.

For example, the glass substrate is alkali-free glass, alkaline glass, strengthened glass or tempered glass. The glass substrate has good flatness, no splicing, high process accuracy, high thermal conductivity, and excellent heat dissipation.

Figure 14:
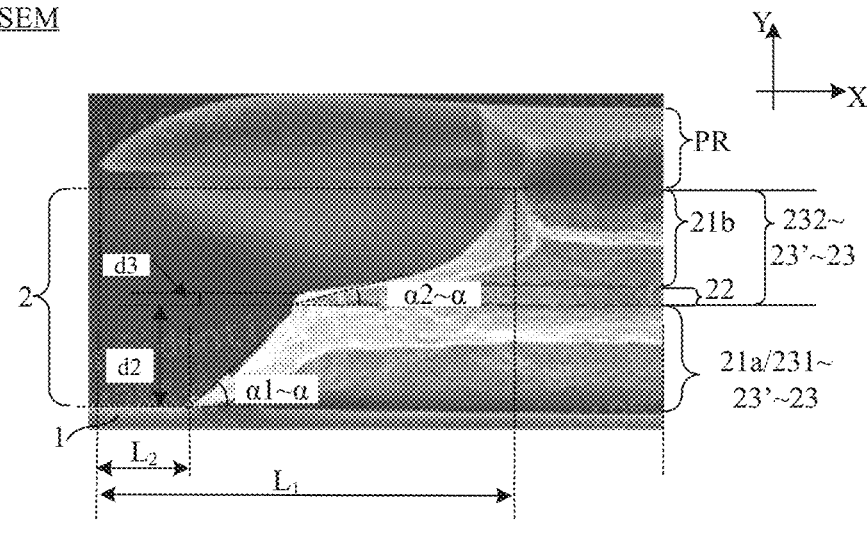
FIG. 14 is an SEM image of a plurality of patterns formed by etching a stress neutral layer, in accordance with some embodiments of the present disclosure.

In some embodiments, as shown in FIG. 14, the stress neutral layer 2 includes a plurality of patterns 23 formed by etching. Each pattern 23 includes sub-patterns 23' respectively formed by stacked layers. That is, each pattern 23 includes a plurality of sub-patterns 23', and the plurality of sub-patterns 23' are stacked in the first direction Y. In a case where the stress neutral layer 2 includes the plurality of first metal layers 21 and the at least one second metal layer 22, in each pattern 23, a slope angle $\alpha$ of a sub-pattern 23' formed by a stacked layer farther from the substrate 1 is less than a slope angle $\alpha$ of a sub-pattern 23' formed a stacked layer closer to the substrate 1. The stacked layer is a portion of the first metal layer 21, a portion of the second metal layer 22, or a portion of a stacked layer formed by the second metal layer 22 and the first metal layer 21 adjacent to each other.

It will be understood that, in the embodiments of the present disclosure, a slope angle of a certain film layer pattern refers to an included angle between a side surface of the film layer pattern and a plane where the substrate 1 is located in a section of the film layer pattern perpendicular to the plane where the substrate 1 is located and perpendicular to an extending direction of the film layer pattern.

In some examples, referring to FIG. 14 again, the first metal layer(s) 21 in the stress neutral layer 2 include two layers spaced apart from each other, i.e., the first metal layer 21$a$ and the first metal layer 21$b$. The second metal layer 22 is disposed between the first metal layer 21$a$ and the first metal layer 21$b$, and the substrate 1, the first metal layer 21$a$, the second metal layer 22 and the first metal layer 21$b$ are stacked in sequence. The first metal layer 21$a$ is a stacked layer, and the second metal layer 22 and the first metal layer 21$b$ are used as a stacked layer. The two stacked layers are etched to form different sub-patterns 23', which are respectively a first sub-pattern 231 and a second sub-pattern 232. The first sub-pattern 231 is closer to the substrate 1 than the second sub-pattern 232, and a slope angle $\alpha 1$ of the first sub-pattern 231 is greater than a slope angle $\alpha 2$ of the second sub-pattern 232.

It will be noted that, as can be seen from FIG. 14, the thickness d2 of the first metal layer 21 is much greater than the thickness d3 of the second metal layer 22. Considering the second metal layer 22 and the first metal layer 21$b$ as an example, when the stress neutral layer is etched, due to the excessively thin second metal layer 22, the first metal layer 21$b$ located on a side of the second metal layer 22 away from the substrate 1 and the second metal layer 22 have a smooth interface transition at an etching interface, so that a slope angle of a sub-pattern formed by etching the first metal layer 21 is substantially equal to a slope angle of a sub-pattern formed by etching the first metal layer 21$b$ and the second metal layer 22 as a whole. Therefore, when the sub-patterns respectively formed by the stacked layers are divided, in the first direction Y from the substrate 1 to the stacked layer, a sub-pattern 23' formed by the second metal layer 22 and the first metal layer 21 arranged adjacent to each other in sequence may be regarded as the same sub-pattern 23'. For example, the sub-pattern formed by the second metal layer 22 and the first metal layer 21$b$ is the second sub-pattern 232.

It will be understood that, in sub-patterns formed after a stacked layer of the first metal layer 21$a$, the second metal layer 22 and the first metal layer 21$b$ is etched, a sub-pattern to which each metal layer corresponds may be considered as an independent sub-pattern. It can be seen from the figure that in each pattern 23, a slope angle $\alpha$ of a sub-pattern formed by a stacked layer farther from the substrate 1 is less than a slope angle $\alpha$ of a sub-pattern formed by a stacked layer closer to the substrate 1.

In each pattern 23 of the stress neutral layer 2, the stacked layers are etched to form the sub-patterns 23'. In all of the sub-patterns 23', the slope angle $\alpha$ of the sub-pattern 23' formed by the stacked layer farther from the substrate 1 is less than the slope angle $\alpha$ of the sub-pattern 23' formed by the stacked layer closer to the substrate 1. That is, slope angles with a gradient are formed in the stress neutral layer 2, which does not affect a coverage of subsequent inorganic material insulating layer(s) (e.g., a first passivation layer 51 and/or a second passivation layer 54) or organic material insulating layer(s) (e.g., an insulating layer 52 and/or a planarization layer 53) on the stress neutral layer, and the stress neutral layer 2 is able to have good adhesion to an inorganic film layer covering the stress neutral layer 2.

Referring to FIG. 14 again, when the stress neutral layer 2 is patterned by using an etching process, a side of the stress neutral layer 2 away from the substrate 1 is covered with a photoresist pattern PR after exposure as a mask. It can be seen that borders of the photoresist pattern PR in a second direction X extend beyond borders of a pattern left by the stress neutral layer 2 in the second direction X after the etching process. That is, after etching, the stress neutral layer 2 generates a certain amount of indent relative to the photoresist pattern PR. Specifically, a border of the photoresist pattern PR in the second direction X extends beyond an outermost border, located on the same side as the border of the photoresist pattern PR, of the sub-pattern formed by the stacked layer in the stress neutral layer 2 closer to the substrate 1 by a length of L2, and extends beyond an innermost border, located on the same side as the border of the photoresist pattern PR, of the sub-pattern formed by the stacked layer in the stress neutral layer 2 farther from the substrate 1 by a length of L1. The second direction X is a direction parallel to the plane where the substrate 1 is located and perpendicular to the extending direction of the film layer pattern.

For example, the etching may be a dry etching process or a wet etching process.

It will be noted that FIG. 14 only shows an SEM image of edge positions of the patterns 23 formed by etching the first metal layer 21 and the second metal layer 22, which does not represent morphologies of other embodiments. That is, FIG. 14 is not a limitation on the formation of the patterns 23 after the first metal layer 21 and the second metal layer 22 are etched. It will be understood that, by adjusting parameters such as a formula or concentration of an etching solution or etching time, after the stress neutral layer 2 is etched, a plurality of stacked layers in the stress neutral layer 2 may have the same slope angle, and side surfaces of the plurality of stacked layers are substantially in the same plane.

In addition, it will be understood that, in the stress neutral layer 2, the material, the thickness and a distance from the substrate 1 of each first metal layer 21 are different, and the material, the thickness and a distance from the substrate 1 of each second metal layer 22 are different, so that a reaction speed between each first metal layer 21 and the etching solution is different, and a reaction speed between each second metal layer 22 and the etching solution is different. In some embodiments, a film layer in the stress neutral layer 2 farthest from the substrate 1 may form a roof structure after being etched (that is, the film layer extends beyond other film layers by a certain length in the second direction X). In this case, the length of the roof structure may be controlled by adding an additive in the etching solution, so as not to exceed 0.5 μm.

In some embodiments, referring to FIG. 14 again, in the plurality of patterns 23 formed by etching, a slope angle α of any sub-pattern 23' included in each pattern 23 is in a range of 20° to 70°, inclusive.

For example, the slope angle α of the sub-pattern 23' in the stress neutral layer 2 is 20°, 30°, 40°, 60°, or 70°, which is not limited herein.

Figure 15:
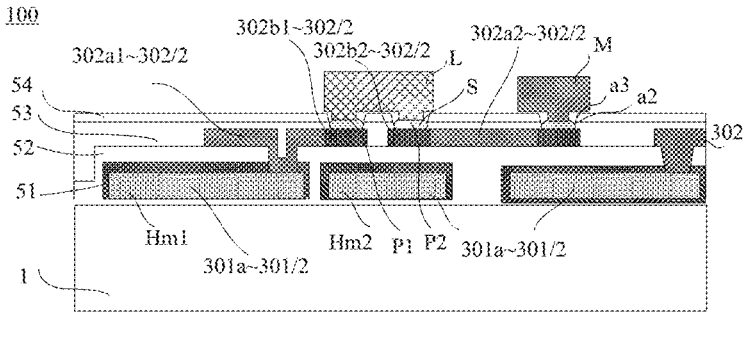
FIG. 15 is a structural diagram of a light-emitting substrate, in accordance with some embodiments of the present disclosure.

Some other embodiments of the present disclosure provide a light-emitting substrate 100. As shown in FIG. 15, the light-emitting substrate 100 includes the above circuit board 10. The light-emitting substrate 100 further includes a plurality of light-emitting devices L.

In some examples, referring to FIG. 15 again, in the light-emitting substrate 100, a first metal layer 301 in the stress neutral layer 2 is provided on a side of the substrate 1, and includes a plurality of first signal lines 301*a*. The first passivation layer 51 is disposed on a side of the first metal layer 301 away from the substrate 1. The insulating layer 52 is disposed on a side of the first passivation layer 51 away from the substrate 1. A second metal layer 302 in the stress neutral layer 2 is provided on a side of the insulating layer 52 away from the substrate 1. The planarization layer 53 is disposed on a side of the second metal layer 302 away from the substrate 1. The second passivation layer 54 is disposed on a side of the planarization layer 53 away from the substrate 1.

For example, the plurality of first signal lines 301*a* includes first power lines Hm2 or second power lines Hm1.

The second metal layer 302 includes a plurality of electrode pads 302*b* including first electrode pads 302*b*1 and second electrode pads 302*b*2, and second signal lines 302*a* connected to at least two of the plurality of electrode pads 302*b*. The plurality of electrode pads 302*b* are electrically connected to pins of the light-emitting devices L and a pixel driving chip M. The pins of the light-emitting device L includes a first pin P1 and a second pin P2, and are respectively connected to a first electrode pad 302*b*1 and a second electrode pad 302*b*2 by a soldering material S (e.g., soldering tin, tin-silver-copper alloy, tin-copper alloy), and the pin of the pixel driving chip M is connected to a corresponding electrode pad 302*b* by a soldering material S (e.g., soldering tin, tin-silver-copper alloy, tin-copper alloy). The planarization layer 53 includes a plurality of second vias a2 penetrating to the second metal layer 302. The second passivation layer 54 includes a plurality of third vias a3 penetrating to the planarization layer 53. A third via a3 corresponds to a second via a2 to form a through hole penetrating the second passivation layer 54 to the electrode pad 302*b* of the second metal layer 302. The second signal lines 302*a* (i.e., wirings) include first wirings 302*a*1 and second wirings 302*a*2. A first wiring 302*a*1 is connected to the first pin P1 of the light-emitting device L through a first electrode pad 302*b*1, and a second wiring 302*a*2 is connected to the second pin P2 of the light-emitting device L through a second electrode pad 302*b*2. The electrode pads 302*b* may be made of one of WNi and WCu.

For example, the pins of the light-emitting device L are respectively connected to two electrode pads 302*b* through respective through holes penetrating the planarization layer 53 and the second passivation layer 54. The pin of the pixel driving chip M is connected to the electrode pad 302*b* through a through hole penetrating the planarization layer 53 and the second passivation layer 54. Thus, the light-emitting device L is able to emit light under a control of the pixel driving chip M.

The first power lines Hm2 or the second power lines Hm1 are formed by using the stress neutral layer 2 formed by the at least one first metal layer 21 and the at least one second metal layer 22, so that a thickness of the first power line Hm2 or the second power line Hm1 is increased to meet a requirement of low resistance, and an influence of warpage is effectively avoided.

For example, a material of the first passivation layer 51 and/or the second passivation layer 54 includes at least one of silicon nitride, silicon oxide and silicon oxynitride, and a material of the insulating layer 52 and/or the planarization layer 53 is an organic material, such as resin.

In some embodiments, the light-emitting device L is a sub-millimeter light-emitting diode or a micro light-emitting diode.

For example, the light-emitting device L is a light-emitting diode for emitting red light, a light-emitting diode for emitting green light, or a light-emitting diode for emitting blue light.

For example, the sub-millimeter light-emitting diode refers to an LED with a die size of about 50 μm to about 200 μm, and the micro light-emitting diode refers to an LED with a die size of less than 50 μm.

Beneficial effects of the light-emitting substrate 100 are the same as those of the circuit board 10 provided by the first aspect of the present disclosure, and will not be repeated here.

Figure 16:
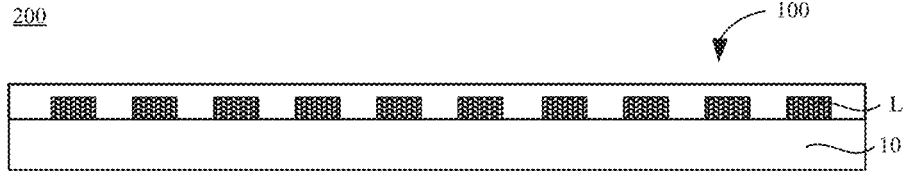
FIG. 16 is a structural diagram of a backlight module, in accordance with some embodiments of the present disclosure.

Some embodiments of the present disclosure further provide a backlight module 200. As shown in FIG. 16, the backlight module 200 includes the above light-emitting substrate 100.

It will be understood that the light-emitting substrate 100 includes the plurality of light-emitting devices L.

Beneficial effects of the backlight module 200 are the same as those of the light-emitting substrate 100 provided by the present disclosure, and will not be repeated here.

Figure 17:
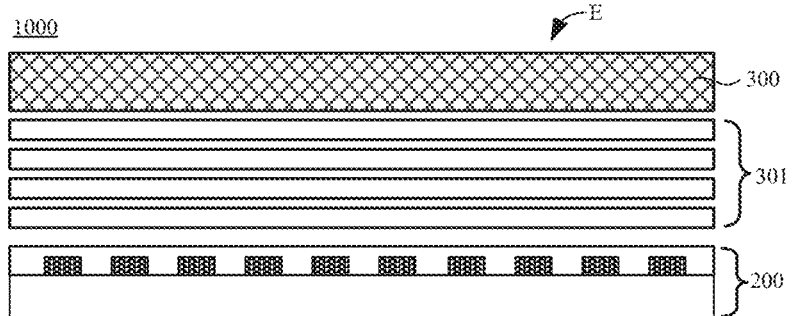
FIG. 17 is a structural diagram of a display device, in accordance with some embodiments of the present disclosure.

Some embodiments of the present disclosure further provide a display device 1000. As shown in FIG. 17, the display device 1000 includes the above backlight module 200, and further includes a liquid crystal display panel 300 connected to the backlight module 200.

It will be understood that the liquid crystal display panel 300 is disposed on a light exit side E of the backlight module 200.

For example, referring to FIG. 17 again, the display device 1000 further includes a plurality of optical films 301 located between the backlight module 200 and the liquid crystal display panel 300 and configured to adjust light emitted from the backlight module 200.

Beneficial effects of the display device 1000 are the same as those of the backlight module 200 provided by the present disclosure, and will not be repeated here.

The display device 1000 may be any device that displays text or images whether moving (e.g., videos) or stationary (e.g., still images). More specifically, it is anticipated that the embodiments may be implemented in, or associated with, a variety of electronic devices. The variety of electronic devices are, for example (but not limit to), mobile phones, wireless devices, personal data assistants (PDAs), hand-held or portable computers, global positioning system (GPS) receivers/navigators, cameras, MP4 video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays for displaying an image of a piece of jewelry).

Figure 18:
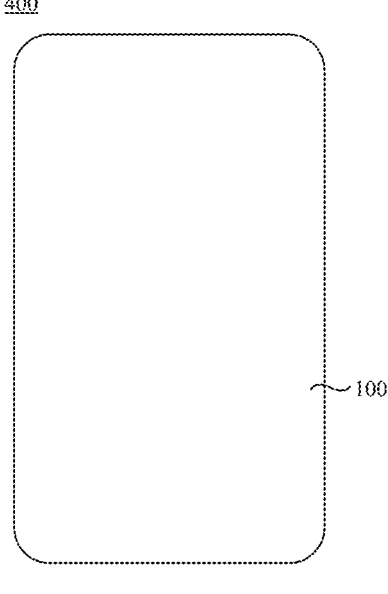
FIG. 18 is a structural diagram of a display panel, in accordance with some embodiments of the present disclosure.

Some embodiments of the present disclosure further provide a display panel 400. As shown in FIG. 18, the display panel 400 includes the above light-emitting substrate 100.

For example, the light-emitting substrate 100 is applied to a Mini LED display screen, so that a dot pitch of the display screen may be further reduced, thereby greatly improving visual effects of a corresponding terminal product and greatly reducing a viewing distance.

Beneficial effects of the display panel 400 are the same as those of the light-emitting substrate 100 provided by the present disclosure, and will not be repeated here.

Figure 19:
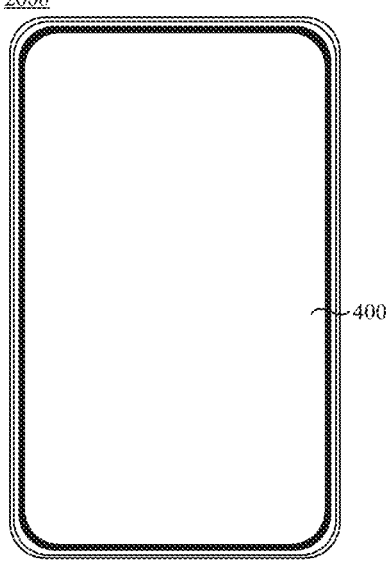
FIG. 19 is a structural diagram of another display device, in accordance with some embodiments of the present disclosure.

Some embodiments of the present disclosure further provide a display device 2000. As shown in FIG. 19, the display device 2000 includes the above display panel 400.

The display device 2000 may be any device that displays text or images whether moving (e.g., videos) or stationary (e.g., still images). More specifically, it is anticipated that the embodiments may be implemented in, or associated with, a variety of electronic devices. The variety of electronic devices are, for example (but not limit to), mobile phones, wireless devices, personal data assistants (PDAs), hand-held or portable computers, global positioning system (GPS) receivers/navigators, cameras, MP4 video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays for displaying an image of a piece of jewelry).

Beneficial effects of the display device 2000 are the same as those of the display panel 400 provided by the present disclosure, and will not be repeated here.

The foregoing descriptions are merely some specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A circuit board, comprising:
a substrate; and
a stress neutral layer disposed on a side of the substrate; wherein
the stress neutral layer includes:
    one or more first metal layers;
    one or more second metal layers; wherein the one or more second metal layers and the one or more first metal layers are stacked; and at least one of the one or more first metal layers is made of a material for generating a tensile stress, and at least one of the one or more second metal layers is made of a material for generating a compressive stress; and
    a plurality of patterns, and each pattern of the plurality of patterns includes sub-patterns respectively formed by stacked layers; in a case where the stress neutral layer includes a plurality of first metal layers and the at least one second metal layer, in the pattern, a slope angle of a sub-pattern formed by a stacked layer farther from the substrate is less than a slope angle of a sub-pattern formed by a stacked layer closer to the substrate; wherein a stacked layer in the stacked layers is any one of a portion of a first metal layer, a portion of a second metal layer, or a portion of a combination film layer of a first metal layer and a second metal layer that are adjacent to each other.

2. The circuit board according to claim 1, wherein the at least one first metal layer is plural in number, and the at least one second metal layer is plural in number; at least one second metal layer is located between two first metal layers, and at least one first metal layer is located between two second metal layers.

3. The circuit board according to claim 1, wherein a sum of thicknesses of all first metal layers of the one or more first metal layers accounts for 70% to 99% of a thickness of the stress neutral layer; and/or
a warpage amount of the stress neutral layer is less than or equal to 1 mm.

4. The circuit board according to claim 1, wherein a material of a second metal layer in the at least one second metal layer includes any one of W, WNi, WCu, WMo, WCr and WAl.

5. The circuit board according to claim 4, wherein a resistance of the second metal layer is in a range of $1 \times 10^{-8}$ $\Omega \cdot m$ to $1 \times 10^{-5}$ $\Omega \cdot m$, inclusive.

6. The circuit board according to claim 1, wherein the material of the at least one first metal layer includes copper.

7. The circuit board according to claim 6, wherein the at least one of the one or more first metal layers further includes at least one buffer layer.

8. The circuit board according to claim 7, wherein a material of a buffer layer includes any one of MoNb, MoNiTi, Ti, Mo and MoTi.

9. The circuit board according to claim 7, wherein a thickness of a buffer layer is in a range of 0 angstroms to 1000 angstroms, inclusive.

10. The circuit board according to claim 1, wherein a thickness of each first metal layer is in a range of 1 μm to 3 μm, inclusive; and
a thickness of each second metal layer is in a range of 300 angstroms to 5000 angstroms, inclusive.

11. The circuit board according to claim 1, wherein a first metal layer in the at least one first metal layer closest to the substrate includes a copper layer and at least one buffer layer; and one of the at least one buffer layer is closer to the substrate than the copper layer.

12. The circuit board according to claim 1, wherein the plurality of patterns are formed by etching.

13. The circuit board according to claim 12, wherein a slope angle of any sub-pattern in the pattern is in a range of 20° to 70°, inclusive.

14. A light-emitting substrate, comprising the circuit board according to claim 1, wherein the stress neutral layer is used for forming wirings and/or electrode pads.

15. The light-emitting substrate according to claim 14, further comprising:

a plurality of light-emitting devices, wherein a light-emitting device includes a first pin and a second pin, the electrode pads include first electrode pads and second electrode pads, and the wirings include first wirings and second wirings; wherein a first wiring is connected to the first pin of the light-emitting device through a first electrode pad; and a second wiring is connected to the second pin of the light-emitting device through a second electrode pad.

16. The light-emitting substrate according to claim 15, wherein the electrode pads are made of one of WNi and WCu; and/or the light-emitting device is a sub-millimeter light-emitting diode or a micro light-emitting diode.

17. A backlight module, comprising the light-emitting substrate according to claim 14.

18. A display device, comprising the backlight module according to claim 17; and a liquid crystal display panel connected to the backlight module.

19. A display panel, comprising the light-emitting substrate according to claim 14.

20. A display device, comprising the display panel according to claim 19.

\* \* \* \* \*